United States Patent
Edwards

(12) 
(10) Patent No.: US 6,518,754 B1
(45) Date of Patent: Feb. 11, 2003

(54) POWERFUL BONDED NONCONDUCTING PERMANENT MAGNET FOR DOWNHOLE USE

(75) Inventor: Carl Edwards, Katy, TX (US)

(73) Assignee: Baker Hughes Incorporated, Houston, TX (US)

(*) Notice: Subject to any disclaimer, the term of this patent is extended or adjusted under 35 U.S.C. 154(b) by 0 days.

(21) Appl. No.: 09/696,489

(22) Filed: Oct. 25, 2000

(51) Int. Cl.[7] .................................................. G01V 3/00
(52) U.S. Cl. ....................................... 324/303; 324/300
(58) Field of Search ................................ 324/309, 318, 324/321, 322, 303, 306, 300; 252/62.55

(56) References Cited

U.S. PATENT DOCUMENTS

| | | | |
|---|---|---|---|
| 5,486,761 A | 1/1996 | Sezginer | 324/303 |
| 5,488,342 A | 1/1996 | Hanley | 335/306 |
| 5,644,231 A | 7/1997 | Wignall | 324/303 |
| 5,888,417 A | 3/1999 | Akioka et al. | 252/62.55 |
| 6,069,479 A | 5/2000 | Taicher et al. | 324/309 |
| 6,452,388 B1 * | 9/2002 | Reiderman et al. | 324/303 |

FOREIGN PATENT DOCUMENTS

DE 40 24 268 A1 * 7/1992

OTHER PUBLICATIONS

John Ormerod et al.; *Bonded Permanent magnets: Current status and future opportunities* (invited), J. Appl. Phys., vol. 81, No. 8, Apr. 15, 1997, pp. 4816–4820.

* cited by examiner

Primary Examiner—Edward Lefkowitz
Assistant Examiner—Brij B. Shrivastav
(74) Attorney, Agent, or Firm—Madan, Mossman & Sriram, P.C.

(57) ABSTRACT

A transverse dipole NMR tool includes a non-conductive permanent magnet made of electrically conductive material such as SmCo. The concentration of SmCo is selected to be at a level low enough to prevent the formation of an electrically conductive path through the magnet. Disposed between the grains of conductive magnet material may be either a ferrite (to increase the remnant magnetization and coercive force) or an inert material. There is a tradeoff between increasing the grain size of the conductive material and the increased intragranular power dissipation. The volume fraction of the conductive material may be increased to a level somewhat higher than a theoretical percolation limit for packed materials; due to randomness in the grain distribution, as long as domains where the percolation limit is exceeded are separate, no conductive path through the magnet results.

28 Claims, 3 Drawing Sheets

POWERFUL BONDED NONCONDUCTING PERMANENT MAGNET FOR DOWNHOLE USE

FIELD OF THE INVENTION

The invention is related to the field of electromagnetic well logging instruments and methods. More specifically, the invention is related to an apparatus and method for improving the performance of nuclear magnetic resonance ("NMR") well logging instruments by increasing the strength of the permanent magnet.

BACKGROUND OF THE INVENTION

Electromagnetic well logging instruments include circuits connected to antennas which induce alternating electromagnetic fields in earth formations surrounding a wellbores, and include circuits which measure various electromagnetic phenomena which occur as a result of interaction of the alternating electromagnetic fields with the earth formations. Such electromagnetic phenomena relate to petrophysical properties of interest of the earth formations. One type of electromagnetic well logging instrument which suffers deleterious effects of eddy currents in electrically conductive elements of the logging instrument is the nuclear magnetic resonance ("NMR") instrument. One type of NMR instrument is described in U.S. Pat. No. 4,710,713 to Taicher et al. Another type of NMR instrument is described in U.S. Pat. No. 4,350,955 to Jackson et al. Both the Taicher '713 instrument and the Jackson '955 instrument include permanent magnets for inducing a static magnetic field in earth formations, and an antenna through which pulses of radio frequency ("RF") energy are conducted. RF energy conducted through the antenna induces an RF magnetic field in the wellbore, in any electrically conductive elements of the NMR instrument and in the earth formations surrounding the instrument. The RF energy passing through the antenna of the NMR instrument therefore causes eddy currents to flow in the wellbore, in the earth formation surrounding the NMR instrument and in any electrically conductive elements in the NMR tool.

In the Jackson '955 patent the antenna acts as a three-dimensional dipole. The direction of a magnetic field generated by the antenna is generally along the direction of the dipole and parallel to its longitudinal axis. This type of antenna is generally referred to as a longitudinal dipole. The antenna induces an RF magnetic field in the wellbore, in the earth formations surrounding the tool and in the permanent magnet material on both sides of the dipole along the longitudinal axis of the tool. To induce an RF magnetic field in the earth formations having sufficient amplitude to make useful NMR measurements, the antenna must also necessarily generate a relatively strong RF magnetic field within the permanent magnet. If the permanent magnet material is electrically conductive, losses of RF power will occur as a result.

The apparatus disclosed in the Taicher '713 patent includes a substantially cylindrical permanent magnet assembly which is magnetized perpendicular to its longitudinal axis. This magnet can be modeled as an infinitely long two-dimensional dipole. The magnet induces a static magnetic field in the wellbore and in the earth formations which has substantially uniform magnetic field strength within any thin annular cylindrical volume at a predetermined radial distance from the magnet. The Taicher '713 apparatus also includes an antenna, wound around the exterior of the magnet, for generating the RF magnetic field and for receiving NMR signals. This antenna can be modeled as an infinitely long two-dimensional dipole. The direction of the magnetic field generated by this antenna is generally perpendicular to its longitudinal axis. This type of antenna is referred to as a transversal dipole antenna. The permanent magnet's dipole is coaxial with and orthogonal to the RF magnetic dipole.

The apparatus disclosed in the Taicher '713 patent has several drawbacks. In particular, the antenna induces an RF magnetic field in the formations surrounding the tool which decreases in strength as the square of the radial distance from the magnet axis. Therefore, to induce an RF magnetic field in the earth formations having sufficient amplitude to make useful NMR measurements within a sensitive volume in the earth formations, the antenna must generate a very strong RF magnetic field, which is also very strong within the space that is occupied by the permanent magnet. If the magnet is made from electrically conductive permanent magnet material, significant losses of RF power will occur as a result of eddy currents flowing in the magnet. The apparatus disclosed in the Taicher '713 patent is generally useful only with an electrically non-conducting permanent magnet material such as ferrite.

Choosing ferrite magnets has a number of consequences. First, the tool diameter and the weight are large because much more magnet material is needed to satisfy the performance criteria. The required diameter reduces the number of wells that can be logged with a tool using ferrite magnets, and smaller diameter tools have decreased performance due to the weaker static field, depth of investigation and signal to noise ratio of the NMR signals. The most significant effect of using ferrite magnets is to induce a large amount of magnetoacoustic ringing in the NMR signals: acoustic waves induced by the RF in the magnet couple back into the antenna creating a signal that may be much larger than the desired NMR signal.

Another NMR logging instrument is described in U.S. Pat. No. 5,055,787 to Kleinberg et al. This logging instrument includes permanent magnets arranged to induce a magnetic field in the earth formation having substantially zero field gradient within a predetermined sensitive volume. The magnets are arranged in a portion of the tool housing which is typically placed in contact with the wall of the wellbore. The antenna in the instrument described in the Kleinberg '787 patent is positioned in a recess located external to the tool housing, enabling the tool housing to be constructed of high strength material such as steel. This outside metallic structure also serves as a shield against RF alternating electromagnetic fields penetrating into the permanent magnet and resulting in RF power losses in the magnet.

Although instrument in the Kleinberg '787 patent reduces eddy current losses in electrically conductive elements of the tool by shielding the permanent magnet, this concept has several significant drawbacks. One such drawback is that the instrument's sensitive volume is only about 0.8 cm away from the tool surface and extends only to about 2.5 cm radially outward from the tool surface. Measurements made by this instrument tool are therefore subject to large error caused by roughness in the wall of the wellbore, deposits of the solid phase of the drilling mud (called "mudcake") onto the wall of the wellbore in any substantial thickness, and by the fluid content of the formation in the invaded zone.

Another way to reduce eddy current losses in the permanent magnet in an NMR logging apparatus is described in U.S. Pat. Nos. 5,376,884 and 5,486,761 to Sezginer. The instruments described in these patents use side-by-side spaced apart elongated magnets and an RF loop in the region between the magnets. Such an arrangement enables using relatively powerful permanent magnets, such as rare-earth magnets, provided that the permanent magnets are properly shielded. The basic disadvantage of the approach taken in the Sezginer '884 and '761 patents is that the relatively large conducting surfaces will disturb the spatial distribution of the RF magnetic field while transmitting, and will reduce the signal to noise ratio ("S/N") while receiving NMR signals.

Generally speaking, the measurement approaches suggested in the Jackson '950 and the Taicher '713 patents are commercially preferred for making NMR measurements of earth formations. The apparatus described in both of these patents are preferably used with substantially non-conductive permanent magnets. Magnetic materials used to make permanent magnets generally fall into two classes: ferrites, which are oxides of ferromagnetic metals; and ferromagnetic metals and their alloys combined with other metals and/or rare earth elements. The first class generally consists of non-conductive permanent magnet materials, and the second class generally consists of electrically conductive materials. Both classes of permanent magnet materials can be used in making so-called "bonded" permanent magnets. Bonded permanent magnets are generally manufactured by pressure bonding or injection molding of magnet material powders in a carrier matrix. The carrier matrix is typically formed from an electrically non-conductive polymeric or epoxy resin. The magnet material density of this form of magnets is lower than magnets made entirely from sintered metallic materials, yielding lower magnetic strength properties in the final product.

U.S. Pat. No. 6,069,479 to Taicher et al, the contents of which are fully incorporated herein by reference, discloses the use of a magnet formed from a powdered, electrically conductive permanent magnet material. The grain size of the magnet material small enough with respect to the frequency of the radio frequency magnetic field to substantially prevent intragranular power loss of the radio frequency magnetic field. The magnet is assembled from electrically isolated blocks of the magnet material each having a thickness less than a skin depth of the radio frequency magnetic field within the magnet material. The boundaries between contiguous ones of the blocks are oriented to interrupt flow of eddy currents in the magnet resulting from the radio frequency magnetic field. In a preferred embodiment of the invention, the magnet material comprises powdered, epoxy resin-bonded Samarium-Cobalt.

Two features limit the effectiveness of the Taicher '479 device. First, the grains of Samarium-Cobalt must satisfy a size constraint dictated by the operating frequency of the tool. The particle diameter must be less than the skin depth of the radio frequency (RF) at the maximum operating frequency. Secondly, the magnet in the Taicher '479 device must be segmented into electrically isolated blocks. This requirement arises from the fact that the epoxy resin-bonded Samarium-Cobalt material has a significant residual conductivity.

The segmentation needed in the Taicher '497 makes the construction of the magnet more complicated: it would be desirable to have a magnet with high remnant magnetization and coercive force without having associated high eddy current losses. It would be desirable to have a permanent magnet material that has lower magnetoacoustic ringing than ferrites. The present invention satisfies the need.

SUMMARY OF THE INVENTION

The present invention is an NMR apparatus having a bonded non-conducting magnet that includes grains of a conducting magnet material at a volume fraction close to a percolation limit wherein the grains form a continuous conducting path through the magnet. The bonding material is preferably epoxy resin while the conducting material may be Samarium-Cobalt or Neodymium-Iron-Boron. In a preferred embodiment of the invention, the magnet includes grains of a ferrite interspersed between the grains of the conductive material, the ferrite grains being smaller than the grains of conductive material. Optionally, an inert material may be used instead of a ferrite as a filler. The grain size may be slightly smaller than the skin depth of the RF field at which the NMR apparatus operates.

DESCRIPTION OF THE PREFERRED EMBODIMENT

Figure 1:
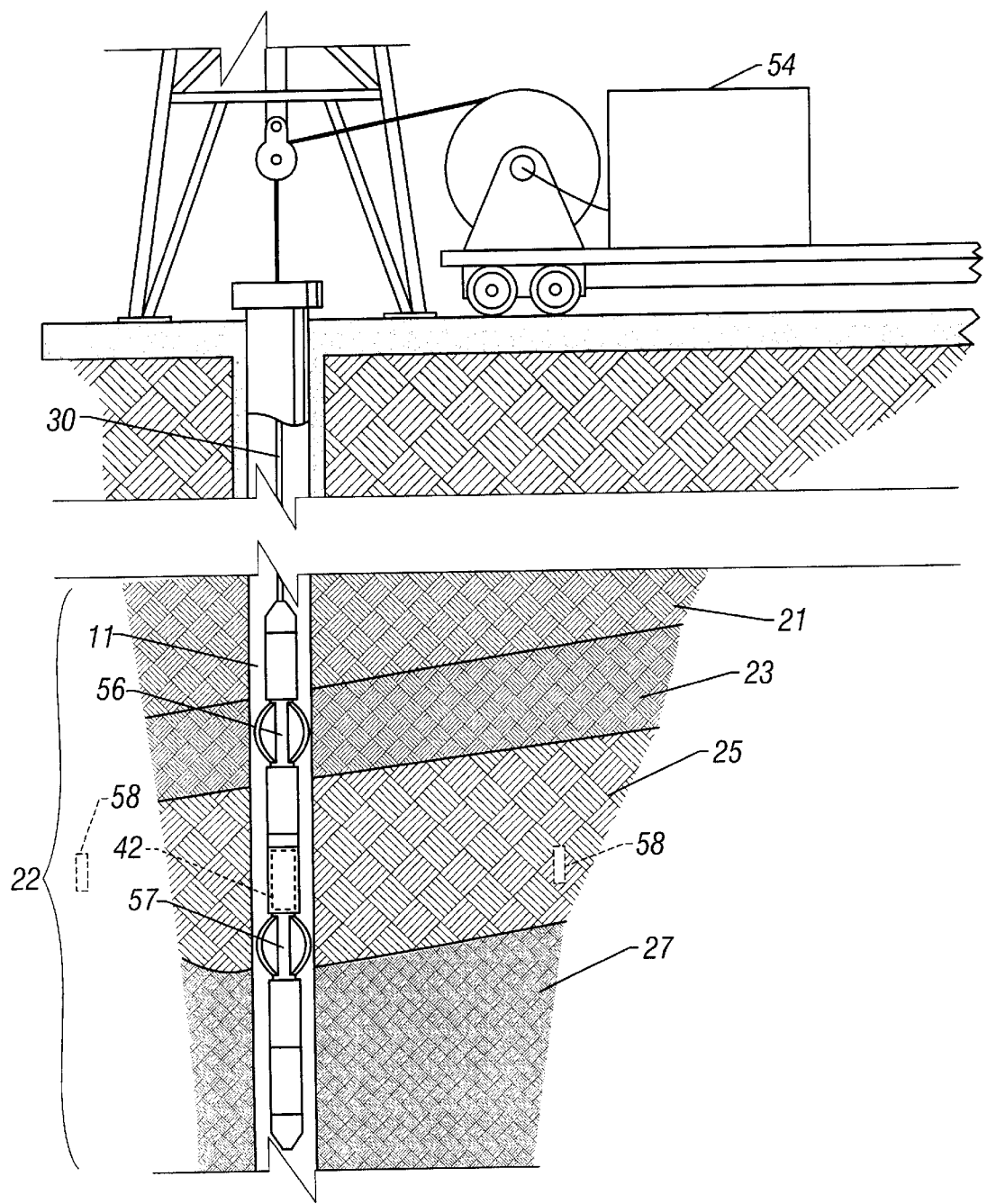
FIG. 1 shows a nuclear magnetic resonance (NMR) well logging apparatus disposed in a wellbore penetrating earth formations.

FIG. 1 shows a well logging apparatus (referred to as a "tool string" 22) disposed in a wellbore 11 drilled through earth formations 21, 23, 25, 27. The tool string 22 includes various sensors for measuring selected properties of the earth formations 21, 23, 25, 27 particularly within a predetermined volume of investigation 58, also referred to as the "sensitive volume". The tool string 22, which can include a nuclear magnetic resonance ("NMR") apparatus according to the invention, is typically lowered into the wellbore 11 by means of a winch-driven armored electrical cable 30 or similar conveyance known in the art. The NMR apparatus can be included in an NMR probe 42, comprising an antenna (not shown in FIG. 1), and a permanent magnet assembly (not shown separately in FIG. 1) made according to the invention forming part of the tool string 22. The tool string 22 can be connected, through the electrical cable 30, to surface equipment 54 including circuitry (not shown separately) for decoding and interpreting signals sent over the cable 30 from the tool string 22. Circuits for decoding and interpreting the signals sent by the tool string 22 over the cable 30 are well known in the art.

The tool string 22 including the NMR probe 42 is preferably centered within the wellbore 11 by means of a top centralizer 56 and a bottom centralizer 57 attached to the tool string 22 at axially spaced apart locations. The centralizers 56, 57 can be of types well known in the art such as bowsprings, or power operated "arms" such as shown in U.S. Pat. No. 4,614,250 issued to Panetta et al, for example. Other types of well logging sensors (not shown separately for clarity of the illustration in FIG. 1) may also form part of the tool string 22.

Figure 2:
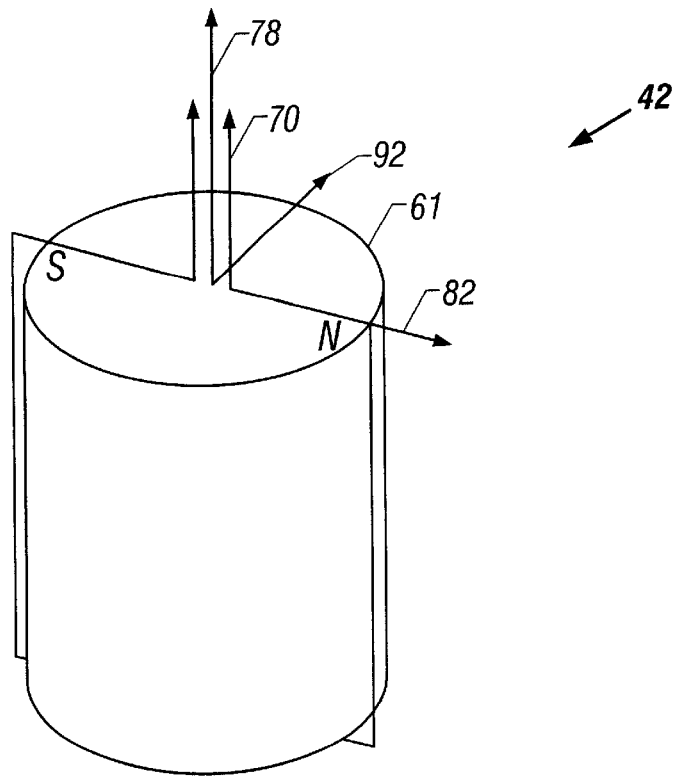
FIG. 2 shows an NMR probe with a transversal dipole antenna.

Referring now to FIG. 2, the NMR probe 42 portion of the tool string (22 in FIG. 1) is shown in a simplified manner. The NMR probe 42 includes a permanent magnet 61, which in this invention can be made from an electrically conductive magnet material. Particular electrically conductive materials from which the magnet 61 preferably is formed will be further explained. The probe 42 also can include an antenna, which in this embodiment can be a transverse dipole antenna 70. The magnet 61 in this embodiment of the invention can have substantially uniform magnetization along a longitudinal axis 78 and a magnetization direction 82 which is substantially perpendicular to the longitudinal axis 78. When radio frequency ("RF") power is passed through the antenna 70, it produces an RF magnetic field in the space outside the probe 42 (which includes the previously described earth formations 21, 23, 25, 27 in FIG. 1) and also inside the volume of the probe 42 itself where the permanent magnet 61 is located. Suitable electronic circuits for generating the RF power to pass through the antenna are well known in the art, as are circuits for measuring the magnitude of the NMR signals induced in the antenna 70. Suitable circuits are described for example, U.S. Pat. No. 4,710,713 to Taicher et al.

The RF magnetic field emanating from the antenna 70 would be homogeneous only if the magnet 61 were to be physically absent, or if the magnet 61 were substantially transparent to the RF magnetic field. A homogeneous RF magnetic field in the space occupied by the magnet 61 would correspond to a sinusoidal distribution, with respect to azimuthal direction about the longitudinal axis 78, of electric current density in the antenna 70. The RF magnetic field direction 92 for the transverse dipole antenna 70 shown in FIG. 2 is substantially perpendicular to the longitudinal axis 78 and is perpendicular to the magnetization direction 82 of the magnet 61. The geometry of the antenna 70 and the magnet 61 of the NMR probe 42 shown in FIG. 2 is used here to illustrate the principles underlying the invention. It is to be clearly understood that the principles of the invention as described herein may be extended to a variety of other antenna configurations and RF field configurations (for example, the RF field generated by a longitudinal dipole antenna) as well as other configurations for the magnet 61. Therefore the configuration of the antenna 70 and magnetization direction 82 of the magnet 61 described herein is not to be construed as a limitation the invention. For example, the material described below with reference to the magnet construction may also be used with the magnet configuration of the Jackson patent. Furthermore, the above description of a logging tool is conveyed on a wireline and it is to be understood that the invention as described below may also be used in measurement-while-drilling (MWD) wherein the NMR sensors are conveyed on a drillstring or other drilling tubular and measurements made during drilling of the wellbore. The invention as described below may also be used in logging while tripping (LWT) applications.

The magnet in the present invention comprises a mixture of powders of nonconductive magnetic material (such as a ferrite) and a conductive magnetic material (such as SmCo) bonded with a plastic resin or other nonconductive material with suitable physical and chemical characteristics. The purpose of mixing the conductive and nonconductive magnetic materials is to maintain good magnetic properties while at the same time increasing the bulk resistivity of the material to levels such that the material can be used in a magnet that is subjected to RF magnetic fields in an NMR sensing device. The fraction of conductive material is less than the amount needed to create a continuous conductive path across the magnet.

Sezginer '761 deals with the problem of a continuous conductive path across the magnet by removing a section of the magnet. This configuration reduces the efficiency of the RF antenna by about 45% and consequently lowers the SNR and raises the power requirements of the tool.

Figure 3:
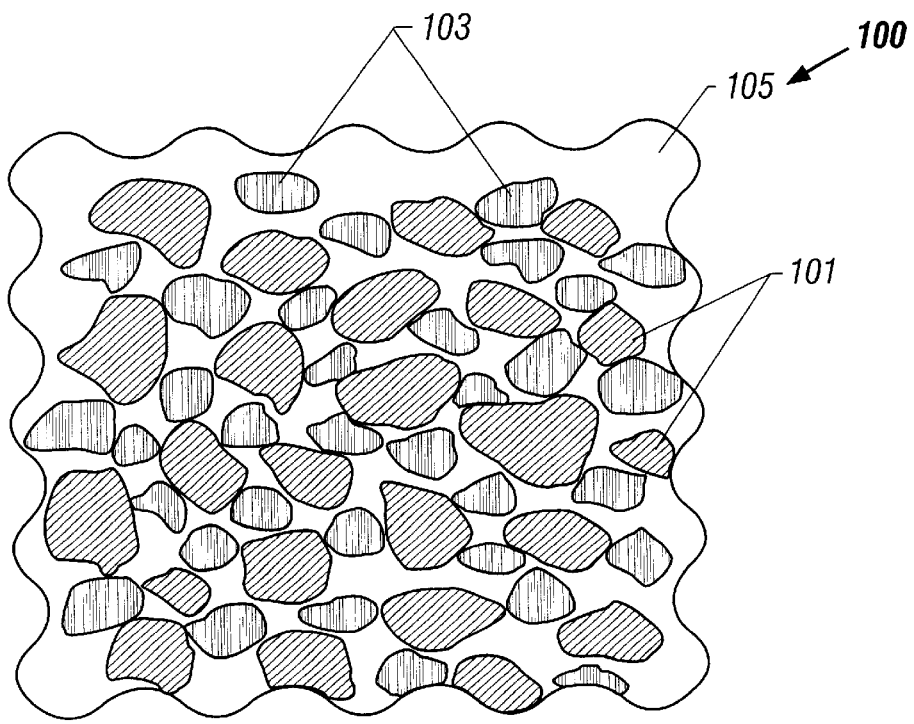
FIG. 3 shows the arrangement of grains within a block of the magnet in the present invention.

In the present invention, the electrically conductive path is interrupted on a small scale. FIG. 3 shows an example of a cross section of a block of the magnet material 100 comprising grains 101 of a conductive magnetic powder, grains 103 of a nonconductive magnetic powder bonded together by a nonconductive, nonmagnetic filler. As can be seen, the concentration of the conductive magnetic material 101 shown with diagonal hatching is low enough that the grains do not make contact with each other, thereby preventing a continuous path for electrical currents to form; instead, the grains of conductive material 101 are separated from each other by the nonconductive material 103 shown with vertical hatching and by the filler 105 shown as white.

The fraction of conductive magnetic material is less than the critical site percolation probability for the specific geometry of the powders. For example, if the grain size of the powders is uniform and the grains are distributed on a simple cubic lattice, the critical site percolation is 0.69; i.e., the conductive material fraction could be that large and still be suitable for use in NMR applications.

Those versed in the art would recognize that properly prepared packs of uniform size powders form into arrangements that are locally close packed but with no long range ordering. In a close packed arrangement, the critical bond percolation probability is about 0.32 and this results in a critical site percolation probability of 0.56. Thus the maximum fraction of conductive magnetic material is about 50% for uniform powder sizes.

The magnetic properties of this magnetic material are hard to model because of the random placement of the two types of materials. Table 1 gives values of the remnant magnetic field $B_r$ and the coercive force $H_c$ for typical magnetic materials and estimates for the performance of bonded mixtures for the present invention.

TABLE I

Comparison of various magnet materials suitable for downhole use when a RF magnetic field penetrates the magnet

| Material | Case | Geometry | Fraction SmCo | Packing factor | Br (kG) | Hci | Br/Br(Ferrite) | Hc/Hc(Ferrite) |
|---|---|---|---|---|---|---|---|---|
| Ferrite | 1 | Sintered | 0.00 | 1.00 | 3.50 | 3.50 | 1.00 | 1.00 |
| Ferrite | 2 | Bonded | 0.00 | 0.57 | 2.00 | 2.00 | 0.57 | 0.71 |
| SmCo | 3 | Sintered | 1.00 | 1.00 | 10.30 | 12.00 | 2.94 | 3.43 |
| SmCo | 4 | Bonded | 1.00 | 0.80 | 8.24 | 9.60 | 2.35 | 2.74 |
| SmCo/Ferrite | 5 | Bonded | 0.50 | 0.70 | 4.83 | 5.43 | 1.38 | 1.55 |
| SmCo/Ferrite | 6 | Bonded | 0.50 | 0.80 | 5.52 | 6.20 | 1.58 | 1.77 |
| SmCo/Ferrite | 7 | Bonded | 0.30 | 0.70 | 3.88 | 4.24 | 1.11 | 1.21 |
| SmCo/Ferrite | 8 | Bonded | 0.30 | 0.80 | 4.43 | 4.84 | 1.27 | 1.38 |
| SmCo/Ferrite | 9 | Bonded | 0.60 | 0.80 | 6.06 | 6.88 | 1.73 | 1.97 |

TABLE I-continued

Comparison of various magnet materials suitable for downhole use when a RF magnetic field penetrates the magnet

| Material | Case | Geometry | Fraction SmCo | Packing factor | Br (kG) | Hci | Br/Br(Ferrite) | Hc/Hc(Ferrite) |
|---|---|---|---|---|---|---|---|---|
| SmCo/Ferrite dual size | 10 | Bonded | 0.30 | 0.89 | 4.93 | 5.38 | 1.41 | 154 |
| SmCo/Ferrite dual size | 11 | Bonded | 0.50 | 0.89 | 6.14 | 6.90 | 1.75 | 1.97 |
| SmCo/Inert | 12 | Bonded | 0.42 | 0.80 | 3.50 | 4.08 | 1.00 | 1.17 |
| SmCo/inert | 13 | Bonded | 0.38 | 0.89 | 3.50 | 4.08 | 1.00 | 1.17 |

Examination of Table I shows that sintered or bonded SmCo (cases 3 or 4) give the greatest improvement over a standard sintered ferrite. However, the material in case 3 or 4 or unsuitable for use in NMR applications due to their high conductivity: the efficiency of the RF antenna could be reduced by a factor of up to 0.45, resulting in a corresponding decrease in signal-to-noise ratio and increase in the power requirements of the tool.

Figure 4:
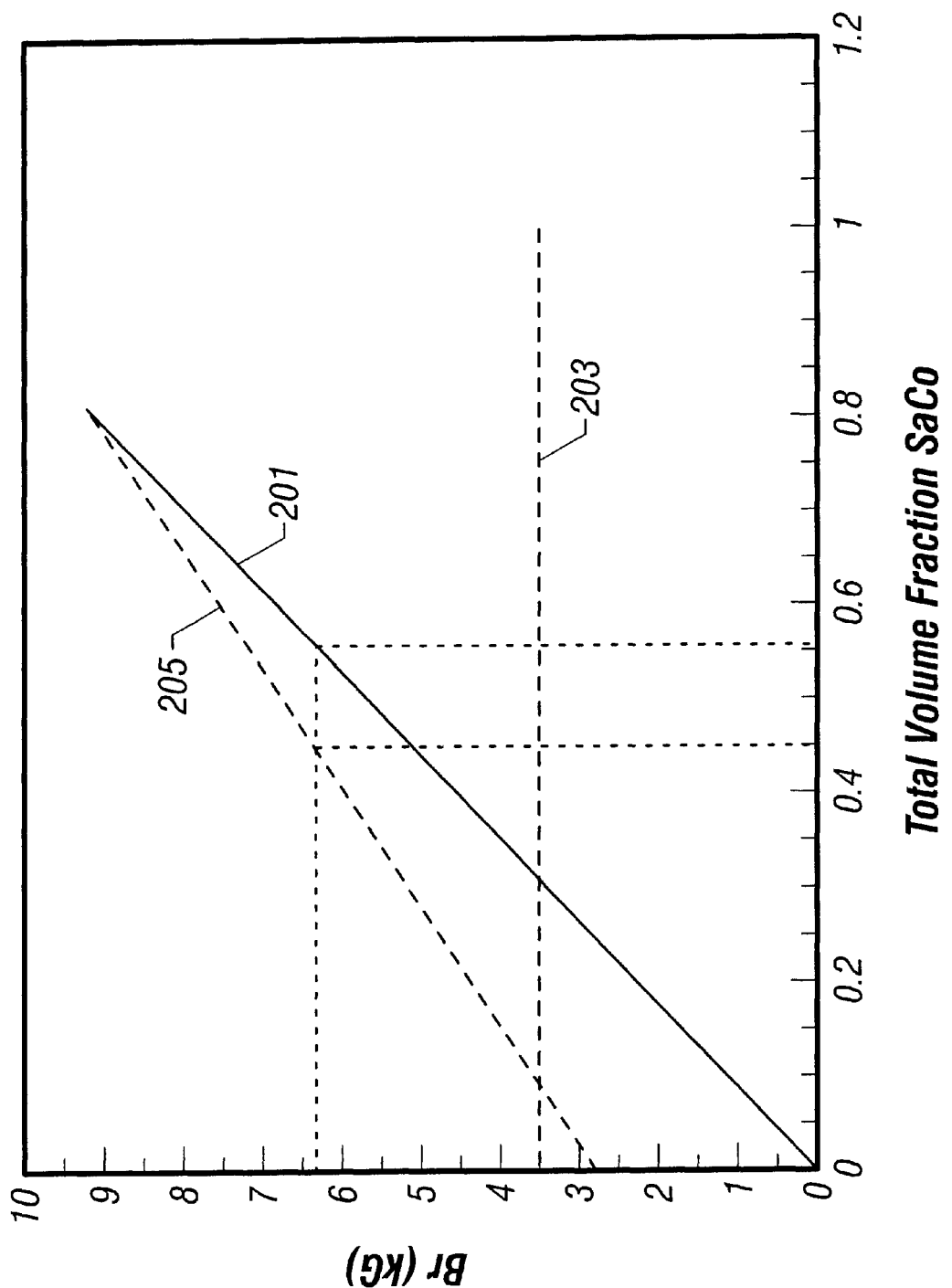
FIG. 4 illustrates the effect of changing the volume fraction of SmCo in the magnet of the present invention.

FIG. 4 illustrates quantitatively the effect of changing the SmCo fraction in a bonded magnet. The abscissa is the volume fraction of SmCo and the ordinate is the remnant magnetization. The curve 201 is for the case where the magnetic material consists entirely of SmCo, i.e., with no ferrite included. The material disclosed in the Taicher '479 patent corresponds to the curve 201 with a volume fraction of SmCo of 0.56. The value 203 is the remnant magnetization for sintered ferrite, showing that for volume fractions greater than about 0.25, the single-phase SmCo magnet has a higher remnant magnetization. The curve 205 corresponds to the case where the magnetic material comprises both ferrite and SmCo. It can be seen that the remnant magnetization is actually higher than for either sintered ferrite or for pure SmCo as the magnetic material.

In the Taicher '479 material, the conductivity of the magnet is nonzero even below the percolation limit of 0.56. This is believed to be caused by capacitive coupling between the conductive particles, although they are electrically isolated at zero frequency. Consequently, the material in Taicher '479 must be further segmented to reduce the eddy currents to acceptable levels.

By mixing conductive and nonconductive magnetic particles at concentrations below the site percolation probability, this capacitive conductance can be controlled. At the same time, the magnet performance is superior to that of ferrite and also the bonded magnet material of Taicher '479. The reduced electrical conductivity means fewer problems with eddy currents. Specifically, ringing artefacts are reduced. Furthermore, due to the reduced amount of heating, the static magnetic field strength is less variable with time and hence the depth of investigation is also more stable.

The preferred embodiment of the invention uses a close packed mixture of ferrite and SmCo magnet material. The powder size is such that the large size (SmCo) forms locally close packed lattice with the small size (Ferrite) just fitting into the interstitial space between the large powder particles. The fraction of SmCo is less than the percolation limit. The material is subject to compression molding to obtain a packing factor of 89%. Case 11 in Table I is the preferred composition.

Due to the difficulty in preparing such a mixture having two different grain sizes, an alternate embodiment of the invention uses case 6 of Table I wherein a single grain size is used. A numerical simulation of case 6 of Table I has been performed in a cross-dipole configuration and shows a 60% increase in magnetic fields strength in regions external to the magnet compared to ferrite. The magnetic field at 20 cm. is 308 G as compared to 176 G for ferrite.

Another alternate bonded magnet material uses an inert filler instead of ferrite (cases 12 and 13 in Table I). Such a composition has the same remnant magnetic field as ferrite while, at the same time, having reduced ringing artefacts and decreased temperature dependence of the depth of investigation characteristic of SmCo/Ferrite mixtures.

Those versed in the art would recognize that with the present invention, the requirement in Taicher that the grain size of the SmCo be less than a critical size determined by the skin depth of the RF frequency can be relaxed somewhat. The grain size larger than the critical size that leads to an acceptable level of RF heating may be easily determined by experiment. Grain sizes up to 10% larger than the critical size would be readily acceptable. Similarly, the volume fraction defined by the percolation limit may also be exceeded slightly: due to the random ordering of the grains, the effect of increasing the volume fraction is to increase the size of a domain wherein the percolation limit is exceeded. As long as such domains exceeding the percolation limit are not in contact with other domains that exceed the percolation limit, there will be no continuous electrically conductive path on a large scale and eddy currents levels would be acceptable. The volume fraction of the SmCo that would be acceptable may be determined by experimentation. Based upon our experimentation, a 10% increase in volume fraction would be acceptable. This is the reason that materials, such as Item 11 in Table I, having a SmCo volume fraction of 0.60 are acceptable even though this is greater than the limit of 0.56 mentioned above.

While the description of the invention above has been made using SmCo as the conductive magnet material, other materials such as Neodymium-Iron-Boron. (NdFeBo).

With a magnet material that comprises a conductive material and a ferrite, magnetoacoustic ringing will still be present due. However, only the ferrite fraction will ring because the constitutive materials have significantly different acoustic impedance and the bonding produces a randomization of the phases of the acoustic signals from each ferrite particle. Consequently, the magnetoacoustic ringing will be much smaller than in when using a magnet made primarily of ferrite. Thus, one embodiment of the invention is a method of reducing magnetoacoustic ringing in an NMR apparatus by replacing a ferrite magnet with a composite non-conducting magnet.

While the foregoing disclosure is directed to the preferred embodiments of the invention, various modifications will be apparent to those skilled in the art. It is intended that all variations within the scope and spirit of the appended claims be embraced by the foregoing disclosure.

What is claimed is:

1. A nuclear magnetic resonance (NMR) apparatus, comprising.

(a) an antenna for inducing a radio frequency (RF) magnetic field in materials to be analyzed;

(b) an antenna for detecting nuclear magnetic resonance signals from said materials; and (c) a non-conducting magnet for inducing a static magnetic field in said materials, said magnet formed from of unsegmented, electrically conductive permanent magnet material bonded by a bonding material, said conductive permanent material having a volume fraction determined by a percolation limit wherein said grains of conductive material form a substantially continuous path.

2. The NMR apparatus of claim 1 wherein the bonding material is en epoxy resin.

3. The NMR apparatus of claim 1 wherein said conductive permanent magnet material is selected from the group consisting of (i) Samarium-Cobalt, and, (ii) Neodymium-Iron-Boron.

4. The NMR apparatus of claim 1 wherein said volume fraction is less than 110% of said percolation limit.

5. The NMR apparatus of claim 1 wherein said grains of conductive material have a maximum size determined by a frequency of said RF magnetic field so as to substantially prevent intragranular power loss therefrom.

6. The NMR apparatus of claim 5 wherein said grains of conductive material have a grain size less than 110% of a skin depth of said RF field at said frequency.

7. The NMR apparatus of claim 1 wherein said non-conducting magnet further comprises an inert non-conducting material disposed between said grains of conductive material.

8. The NMR apparatus of claim 1 wherein said non-conducting magnet further comprises grains of a ferrite disposed between said grains of conductive material.

9. The NMR apparatus of claim 8 wherein said grains of said ferrite have a grain size less than a grain size of said conductive material.

10. The NMR apparatus of claim 7 wherein said volume fraction of SmCo is less than 0.46.

11. The NMR apparatus of claim 8 wherein said volume fraction of SmCo is less than 0.55.

12. The NMR apparatus of claim 1 wherein said antenna comprises a transversal dipole antenna disposed on an exterior surface of said magnet.

13. In a nuclear magnetic resonance (NMR) apparatus, including:

(i) an antenna for inducing a radio frequency (RF) magnetic field in materials to be analyzed;

(ii) an antenna for detecting NMR signals from said materials; and (iii) a non-conducting magnet consist primarily of ferrite for inducing a static magnetic field in said materials, a method of reducing magnetoacoustic ringing in said NMR signals comprising:

(a) forming a composite magnet from grains of an unsegmented, electrically conductive permanent magnet material bonded by a bonding material, said conductive permanent magnet material having a volume fraction determined by a percolation limit wherein said of conductive material form a substantially continuous path, and (b) replacing sad non-conducting magnet consisting primarily of ferrite with sad composite magnet.

14. The method of claim 13 wherein forming the composite magnet further comprises using an epoxy resin as the bonding material.

15. The method of claim 13 wherein forming the composite magnet further comprises selecting as said conductive permanent magnet material a material selected from the group consisting of (i) Samarium-Cobalt, and, (ii) Neodymium-Iron-Boron.

16. The method of claim 13 wherein said volume fraction is less than 110% of said percolation limit.

17. The apparatus of claim 1 wherein said antenna for inducing a RF magnetic field is the same as the antenna for detecting nuclear magnetic resonance signals.

18. The apparatus of claim 8 wherein said ferrite further comprises a permanent magnet material.

19. The method of claim 13 wherein said antenna for inducing a RF magnetic field is the same as the antenna for detecting nuclear magnetic resonance signals.

20. The method of claim 13 wherein forming the composite magnet further comprises dispersing grains of a ferrite therein.

21. The method of claim 20 wherein said ferrite comprises a permanent magnet material.

22. A nuclear magnetic resonance (NMR) apparatus, comprising:

(a) an antenna for inducing a radio frequency (RF) magnetic field in materials to be analyzed;

(b) an antenna for detecting nuclear magnetic resonance signals from said materials; and (c) a non-conducting magnet for inducing a static magnetic field in said materials, said magnet formed from grains of:

(A) an electrically conductive permanent material, and (B) grains of a ferrite disposed between said grains of conductive material, bonded by a bonding material, said conductive permanent magnetic material having a volume fraction determined by a percolation limit wherein said grains of conductive material form a substantially continuous path.

23. The NMR apparatus of claim 22 wherein the bonding material is an epoxy resin.

24. The NMR apparatus of claim 22 wherein said conductive permanent magnet material is selected from the group consisting of (i) Samarium-Cobalt, and, (ii) Neodymium-Iron-Boron.

25. The NMR apparatus of claim 22 wherein said volume fraction is less than 110% of said percolation limit.

26. The NMR apparatus of claim 22 wherein said of conductive material have a maximum size determined by a frequency of said RF magnetic field so as to substantially prevent intragranular power loss therefrom.

27. The NMR apparatus of claim 22 wherein said grains of said ferrite have a grain size less than a grain size of said conductive material.

28. A nuclear magnetic resonance (NMR) apparatus, comprising:

(a) an antenna for inducing a radio frequency (R) magnetic field in materials to be analyzed;

(b) an antenna for detecting nuclear magnetic resonance signals from said materials; and (c) a non-conducting magnet for inducing a static magnetic field in said material, said magnet formed from grains of:

(A) an electrically conductive permanent magnet material and (B) an inert non-conducting material disposed between said grains of conductive material, bonded by a bonding material, said conductive permanent magnet material having a volume on determined by a percolation limit wherein said grains of conductive material form a substantially continuous path.

* * * * *

UNITED STATES PATENT AND TRADEMARK OFFICE
CERTIFICATE OF CORRECTION

PATENT NO. : 6,518,754 B1 Page 1 of 1
DATED : February 11, 2003
INVENTOR(S) : Carl Edwards It is certified that error appears in the above-identified patent and that said Letters Patent is hereby corrected as shown below:

Column 9,
Line 6, please insert the word -- grains -- after "from".
Line 9, please insert the word -- magnet -- after "permanent".
Line 50, please delete "consist" and replace with -- consisting --.
Line 57, please insert the word -- grains -- after "said".

Column 10,
Line 27, please insert the word -- magnet -- after "permanent".
Line 43, please insert the word -- grains -- after "said".
Line 64, please insert the word -- fraction -- after "volume".

Signed and Sealed this

Twenty-fifth Day of March, 2003

JAMES E. ROGAN
*Director of the United States Patent and Trademark Office*